(12) United States Patent
Guilmain et al.

(10) Patent No.: US 6,204,502 B1
(45) Date of Patent: Mar. 20, 2001

(54) HEAT RADIATION DETECTION DEVICE AND PRESENCE DETECTION APPARATUS USING SAME

(75) Inventors: Pierre Guilmain, Besozzo (IT); Pierre Thery, Villeneuve-d'Ascq (FR); Christophe Korn, Taino (IT)

(73) Assignee: Communaute Europeene de l'Energie Atomique (Euratom) (LU)

( * ) Notice: Subject to any disclaimer, the term of this patent is extended or adjusted under 35 U.S.C. 154(b) by 0 days.

(21) Appl. No.: 09/117,041

(22) PCT Filed: Jan. 24, 1997

(86) PCT No.: PCT/FR97/00142

§ 371 Date: Oct. 26, 1998

§ 102(e) Date: Oct. 26, 1998

(87) PCT Pub. No.: WO97/27634

PCT Pub. Date: Jul. 31, 1997

(30) Foreign Application Priority Data

Jan. 26, 1996 (LU) .......................................................... 88704

(51) Int. Cl.[7] .......................... H01L 35/08; G08B 13/193
(52) U.S. Cl. ..................... 250/353; 250/349; 250/DIG. 1
(58) Field of Search ............................. 250/DIG. 1, 353, 250/349

(56) References Cited

U.S. PATENT DOCUMENTS

| 4,179,691 | * | 12/1979 | Keller ..................................... 340/567 |
| 5,045,123 | | 9/1991 | Hattori et al. . |
| 5,059,543 | | 10/1991 | Wise et al. . |

FOREIGN PATENT DOCUMENTS

| 1566748 | | 7/1971 | (DE) . |
| 58-171873 | | 8/1983 | (JP) . |
| 3-82988 | * | 4/1991 | (JP) ................................. 250/DIG. 1 |

\* cited by examiner

Primary Examiner—Constantine Hannaher
(74) Attorney, Agent, or Firm—Bacon & Thomas PLLC

(57) ABSTRACT

A device for detecting thermal radiation having a detector and a reflector type concentrator. The detector is arranged to have one or more portions exposed to thermal radiation and one or more portions protected from thermal radiation, wherein the detector delivers detection signals on the basis of a temperature difference between the exposed portions and the protected portions. The detector supports pairs of planar thermocouple elements having a cold junction in contact with the protected portion of the detector and a hot junction in thermal contact with the exposed portion of the detector. The reflector type concentrator concentrates thermal radiation coming from a three-dimensional zone. The detector and the reflector type concentrator are combined to define a zone under surveillance and detect any change in the state of thermal unbalance in the zone under surveillance.

12 Claims, 4 Drawing Sheets

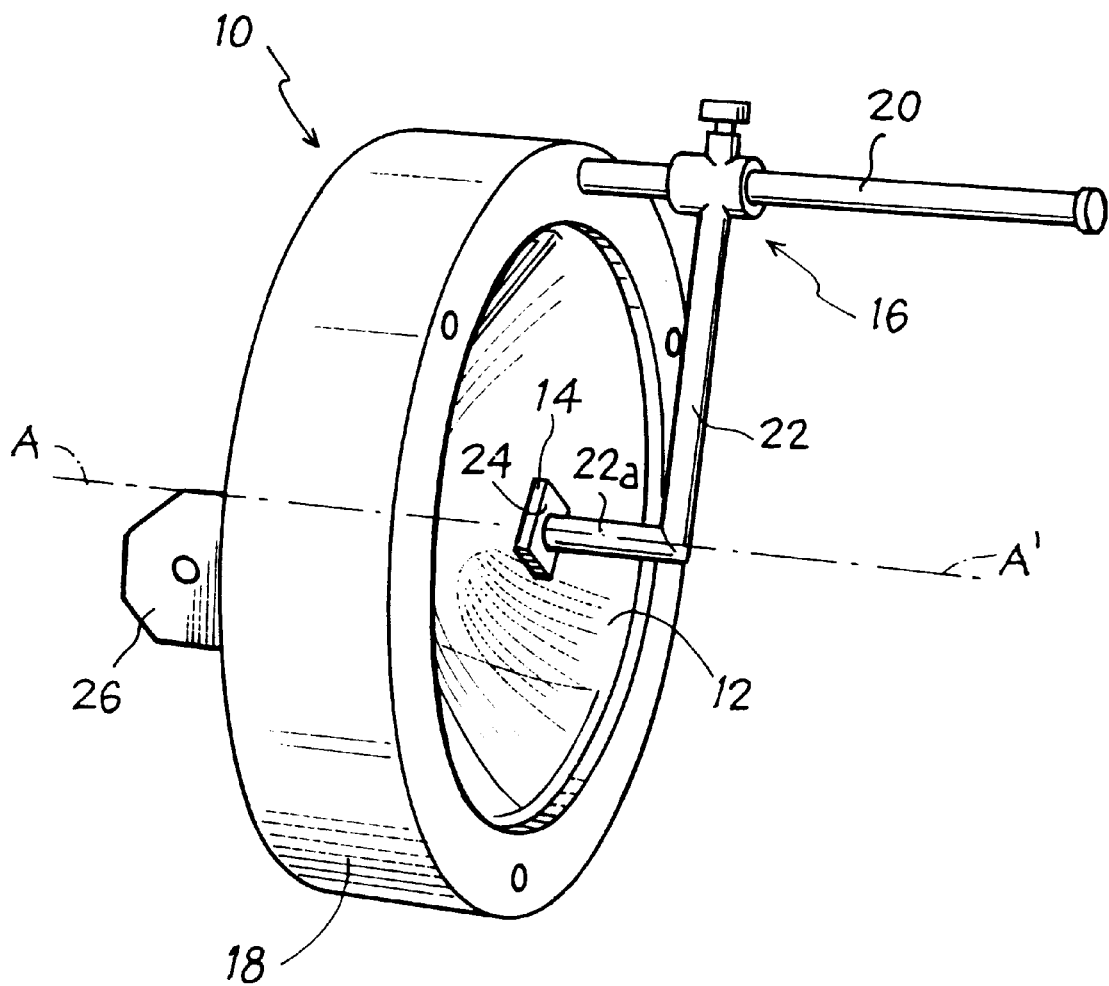
FIG_1

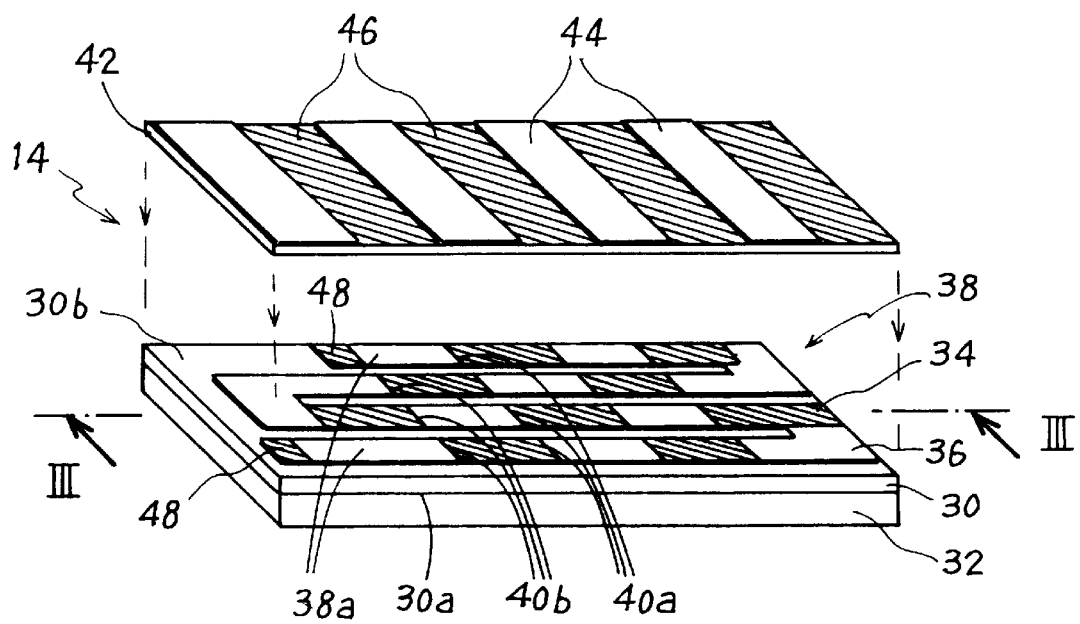
FIG_2
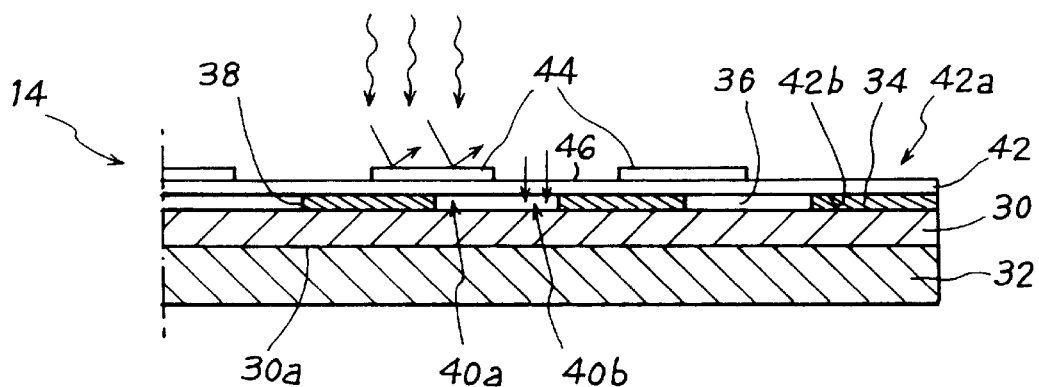
FIG_3

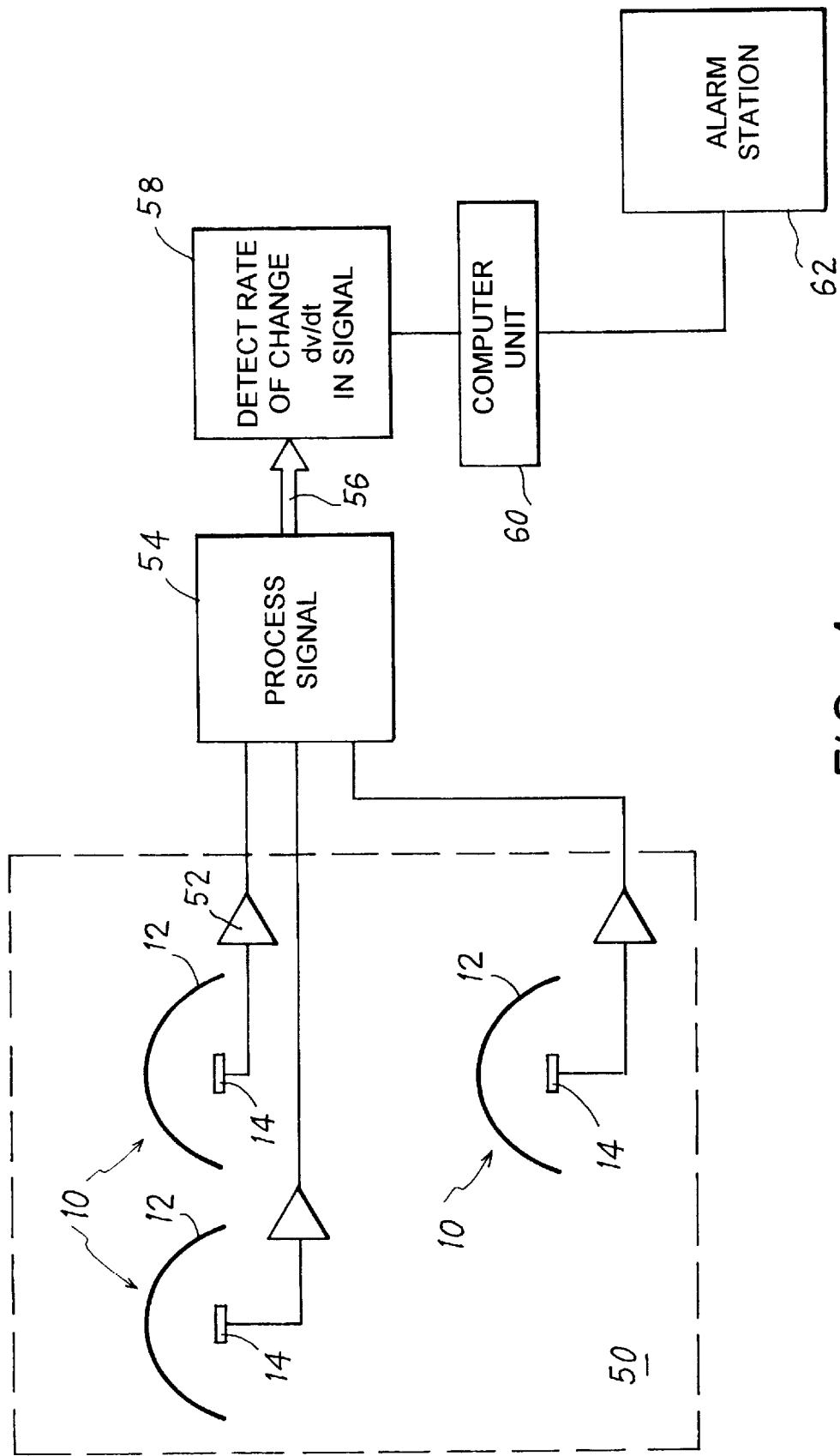
FIG_4

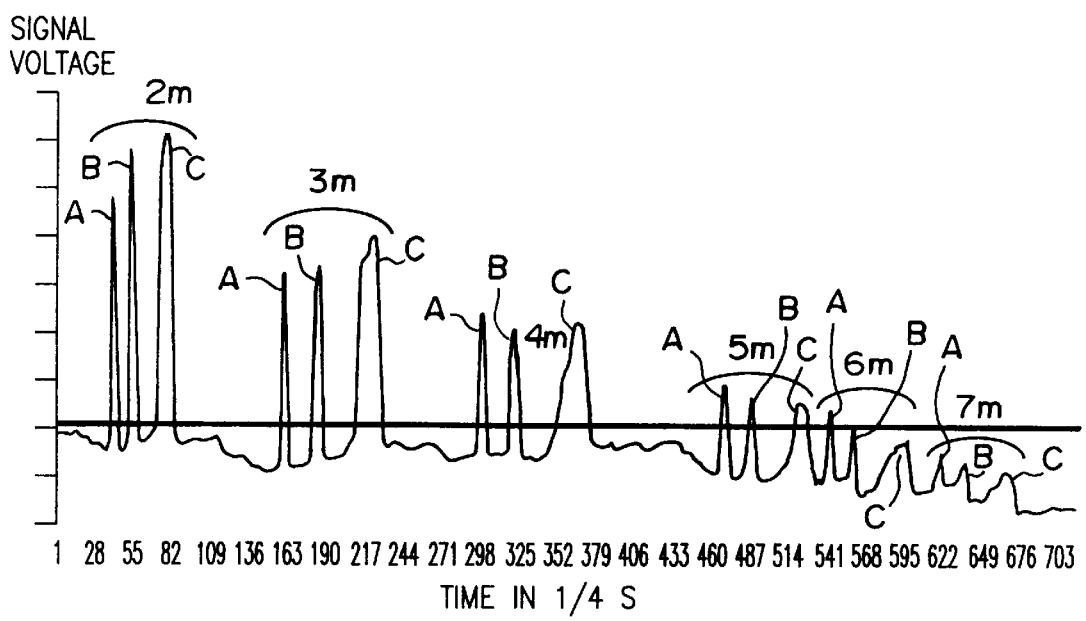
FIG_ 5

HEAT RADIATION DETECTION DEVICE AND PRESENCE DETECTION APPARATUS USING SAME

BACKGROUND OF THE INVENTION

1. Field of the Invention

The present invention relates to a device for detecting thermal radiation, and to presence detection apparatus based on such a device. The invention can be used particularly, but not exclusively, for detecting intrusion into a security zone under surveillance.

2. Related Art

In the field of high-security surveillance, e.g. monitoring premises for storing nuclear material, it is essential for monitoring objects that are in the zone under surveillance failure and without interruption.

At present, in order to ensure continuity of knowledge concerning a situation that is under surveillance, e.g. a quantity of fissile material, and in order to keep a zone of finite dimensions under surveillance, use is made of systems based on seals, whether electronic or otherwise (with identity and/or integrity), of optical surveillance systems (using cameras), and of a range of conventional detectors.

Systems based on seals are generally insufficient because most of them can be used only once, and they are incapable of providing remote surveillance.

With video surveillance systems, the large amount of investment that is required, the image and signal processing that is necessary for detecting an intrusion, and the possibility of error by a spurious image, lead to enormous drawbacks when used in high security surveillance setups.

In most detection applications, traditional surveillance systems based on ultrasound are used for measuring radiation from moving sources. The principle on which they are based is difficult to use for remote surveillance while still allowing movement to take place in a portion of the same premises that is not under surveillance.

Surveillance by means of ultrasound detectors becomes impossible whenever some movement is to be expected around the boundaries of the zone under surveillance since such detectors respond specifically to movement and molecular vibration.

Numerous pyroelectrical and semiconductor devices are commonly used for detecting thermal radiation emitted by a moving source. Since thermal radiation varies with the emissivity of a surface, such detectors suffer from the major drawback of having their responsiveness dependant on wavelength. It is therefore necessary to select a detector as a function of the source to be detected since the detector operates in a narrow frequency band. In addition, detectors of those types are themselves heated by the radiation they receive, and they always require a cooling system.

It can thus be deduced that for an application seeking to provide high security surveillance of a specified zone, the systems mentioned above present at least one of the following drawbacks:

responsiveness is nearly always dependent on wavelength, thereby making it necessary to select a specific detector as a function of the source to be detected;

with infrared or ultrasound systems, only movement is detected in the detection area. Such systems provide detection information due only to the movement of a source of thermal radiation in the zone under surveillance, but no information concerning presence;

an optical lens is generally used for focusing incident rays, thereby giving rise to an undesirable filter effect;

encapsulation is normally necessary in order to eliminate external noise resulting from convection currents;

a cooling device needs to be provided in many cases; and with ultrasound systems, it is not possible to focus surveillance on a particular zone of finite dimensions without suffering disturbances from people or objects moving around the boundaries of said zone.

Thus, an object of the present invention is to provide a device for detecting thermal radiation that does not suffer from the above-mentioned drawbacks.

SUMMARY OF THE INVENTION

The device of the invention is characterized in that it comprises:

a detector having one or more portions designed to be exposed to the thermal radiation, and one or more portions designed to be protected from the thermal radiation, the detector delivering a detection signal on the basis of a temperature difference between the exposed portions and the protected portions; and a reflector type concentrator associated with said detector to concentrate thereon the thermal radiation coming from a predetermined three-dimensional zone.

Combining a reflector type of concentrator with a detector of the above-specified type makes it possible to define a zone under surveillance accurately and to detect any change in the state of thermal unbalance in the zone under surveillance. It will be observed that the detector responds to a small temperature difference representative of the difference between the amount of energy absorbed and transformed into heat flux in exposed regions and in non-exposed regions.

Advantageously, the concentrator is a parabolic reflector.

In a preferred embodiment, the detector is mounted to move relative to an axis of the concentrator in order to make it easy to adapt the detection field merely by adjusting position.

Also, the use of a concentrator advantageously replaces the use of an optical lens for focusing the incident thermal radiation, thereby avoiding transmission losses or losses due to the capacitive effect of the lens material.

The operating principle and the manufacturing technology used for the detector make it possible to avoid conventional cooling problems which require cryostats or Peltier effect devices which are expensive and consume power.

Even at very low temperature, the detector is sensitive to any object that emits thermal radiation in a very broad band extending from 0.75 micrometers ($\mu$m) to 1,000 $\mu$m, i.e. covering the range from the visible to microwaves. It makes it possible to provide information representative of instantaneous variations in energy unbalance between a system and its environment, and can thus operate as a heat flux meter under varying conditions.

In a preferred embodiment, the detector is made up of at least one pair of planar thermocouple elements having a cold junction in thermal contact with a protected portion of the detector, and at least one hot junction in thermal contact with an exposed portion of the detector.

The exposed portion(s) and the protected portion(s) of the detector may constitute a common active surface of the detector, being respectively constituted by surface elements that are substantially absorbent and by surface elements that are substantially reflective relative to thermal radiation.

In an embodiment having a shape that is particularly advantageous, the detector comprises a plurality of pairs of thermocouple elements mounted in series and disposed in a plurality of lines interconnected at their ends so as to form a meandering path, the cold and hot junctions being disposed in respective alternate rows extending across the lines and being in thermal contact with a material which presents the sensitive surface in the form of reflective strips and absorbent strips arranged in rows of alternating phase in alignment respectively with the cold junctions and with the hot junctions.

By way of example, the thermocouple elements are made up of alternating elements of copper and of constantan deposited on a substrate of electrically insulating material such as the material known under the name "KAPTON" which is a trademark registered by Dupont de Nemours, and the thermocouple elements are covered in a material that is substantially transparent to thermal radiation, which may also be KAPTON, the portions of the material covering the cold junction being coated in a layer of reflecting material. The reflective portions may be obtained by depositing gold on the surface of the material covering the thermocouples.

Advantageously, the surface of the substrate opposite from its surface supporting the thermocouple elements is coated in a layer of metal for being put into contact with a mechanical support surface.

The invention also provides presence detection apparatus comprising at least one thermal radiation detector device of the above-specified type, and control means receiving the detection signal(s) and issuing a signal that indicates presence as a function of the detection signal(s).

Other advantages and characteristics of the invention appear on reading the following description of a preferred embodiment given purely by way of example, with reference to the accompanying drawings, in which:

BRIEF DESCRIPTION OF THE DRAWINGS

FIG. 1 is a simplified diagram of a detection assembly made up of a thermal detector and a reflector in accordance with the present invention;

FIG. 2 is a perspective view of a thermal radiation detector used in an embodiment of the invention, but shown in a form that is simplified, particularly concerning its number of active elements;

FIG. 3 is a section view on line III—III of the detector of FIG. 2;

FIG. 4 is a block diagram of a surveillance system making use of detection assemblies of FIG. 1; and FIG. 5 is an example of the plot of the signal picked up by the FIG. 4 surveillance system under various circumstances.

DETAILED DESCRIPTION OF THE INVENTION

FIG. 1 shows a detection assembly 10 comprising a parabolic reflector 12 and a thermal radiating detector 14. The detector has an active surface held facing the reflector by a support structure 16. The reflector 12 is held securely around its circumference by a case 18. The support structure comprises a first rod 20 secured to one end of the case and extending parallel to the main axis A–A' of the reflector 12 in its flare direction.

A second rod 22 is slidably mounted on the first rod 20 and at right angles relative thereto. The second rod 22 is terminated towards its free end by a right-angled portion 22a in alignment with the main axis A–A' of the reflector 12. The free end of the portion 22a of said second rod 22 has a support surface 24 for the detector 14, thus enabling the detector to be positioned at a determined point relative to the reflector, e.g. at its focus, by sliding the second rod 22 along the first rod 20.

The detection assembly is fixed to a base by means of fixing tabs 26 projecting from the case 18.

FIGS. 2 and 3 show the thermal radiation detector 14 used in the detection assembly in greater detail, but in a form that is simplified, particularly with respect to the number of active elements. The detector 14 comprises a substrate 30 of flexible material, such as "KAPTON", of thickness lying substantially in the range 20 micrometers ($\mu$m) to 60 $\mu$m. The surface 30a of the substrate that is designed to face the support of the detector 24 has a deposit of isothermal material 32, e.g. a metal such as copper, of a thickness lying substantially in the range 20 $\mu$m to 100 $\mu$m.

The other surface 30b of the substrate 30 has a succession of thermocouple elements 34, 36 forming a continuous track 38. The track is configured in the form of a plurality of parallel main lines that are about 5 mm long and about 0.5 mm wide, interconnected at their ends so as to form a continuous path that meanders from one end to the other of the track. The track 38 is made up of a deposit of constantan coated in copper on successive discontinuous short portions 38a. Each copper/constantan interface at the surface of the track 38 creates a planar thermocouple junction 40a, 40b.

The configuration of the main parallel lines of the track 38 is such that the thermocouple junctions 40a, 40b are disposed in rows perpendicular to the main lines of the track.

The track 38 is covered in a film 42 having a thickness of 5 $\mu$m to 25 $\mu$m and made of a material that is substantially transparent to thermal radiation and that is electrically insulating, e.g. KAPTON. The surface 42a of this film opposite from its surface 42b which is in contact with the track 38 (FIG. 3), constitutes the active surface of the detector. Its function is to respond to thermal radiation by creating alternating cold and hot areas over the successive thermocouple junctions 40a, 40b along the track 38.

To this end, the film 42 is coated, on surface portions over junctions that are to define cold junctions 40a, in a deposit of reflective material 44, e.g. a layer of gold having thickness lying in the range 0.1 $\mu$m to 5 $\mu$m. In this way, the reflecting material 44 comprises a series of strips overlying every other row of junctions. The surfaces 46 of the film 42 that are not coated in reflecting material 44 constitute absorbent surface portions situated in complementary manner over the junctions that are to define hot junctions 40b. These surface portions 46 may optionally be covered in a material that is highly absorbent to thermal radiation, such as a black paint. Optionally, for an even more absorbent active surface 42a, the film may be made of KAPTON of the "special black body" type as sold by Dupont de Nemours.

When the active surface 42a of the detector 14 receives thermal radiation due to the appearance of a heat source, e.g. a person, the portions 46 of the film 42 that are not coated in reflecting material 44 are subjected to a temperature rise that is greater than that to which the portions coated in reflecting material are subjected. This generates a temperature difference on the active surface of the detector which is transmitted to the underlying thermocouple junction elements 34, 36. As a result, an alternating sequence of cold and hot junctions 40a, 40b is obtained along the track 38 of junctions. Each pair of adjacent cold and hot junctions 40a, 40b produces an electromotive force by the Seebeck effect. A succession of elementary batteries is thus obtained in series along the track 38, thereby delivering a detection signal in the form of a potential difference between the two ends of the track 38. Ohmic contacts 48 soldered to the two ends serve to pick up the detection signal. This signal is proportional to the temperature difference created in response to the thermal radiation concentrated by the reflector 12 on the active surface of the detector 14. It is therefore representative of the thermal flux received on the active surface 42a of the detector 14.

The detector 14 is easily implemented by the person skilled in the art of printed circuit technology. The device is extremely flat, its thickness being less than 0.2 mm, it is of rectangular or square format, or indeed of circular format, and it occupies an area that typically lies in the range 0.25 $cm^2$ to 1 $cm^2$. It typically comprises 150 to 200 thermoelectric junctions in series, however fabrication technology makes it possible to implement a much larger number of junctions on a common substrate.

A detector of the type described provides typical sensitivity in the range 1.5 $\mu Vm^2/W$ to 2.0 $\mu Vm^2/W$, and presents very low internal electrical resistance, of the order of 200 ohms. This characteristic makes it possible to amplify the signal by a large factor, in the range 1,000 to 10,000, or even more in some applications, without being troubled by noise from the source.

In radiation detection mode, the detector has a time constant of about 100 ms.

The fabrication technology and the choice of component materials for the detector make use possible at ambient temperatures up to 250° C. by contact.

FIG. 4 is a block diagram of an example of a surveillance system implemented using the detection assembly 10 of FIG. 1.

In the example, a plurality of thermal radiation detection assemblies 10 are installed in premises 50, such as a warehouse. Each assembly has a well-defined detection field corresponding to a specific surveillance zone. The detection field is matched to the required surveillance zone by acting on one or more of the following parameters: the shape of the reflector 12, its size, the distance between the detection assembly and the base of the surveillance zone, the orientation of the reflector in the surveillance zone, and possibly also the position of the sensitive surface of the detector 14 relative to its reflector 12. With a parabolic reflector of small size, a relatively uniform detection field is obtained over a conical volume around the detector. The base of the cone, which defines the detection surface, can easily be modulated to obtain circular outlines or oval outlines of various dimensions by acting solely on the distance and the orientation of the reflector relative to said detection surface.

The output signal from each detection assembly is transmitted to a respective preamplification stage 52 of gain that is adjustable over a range of about 100 to about 10,000. The preamplified signal may optionally be processed by filter, peak limiting, or digitizing units (given overall reference 54) depending on the nature of the surveillance.

After preamplification and optional processing, the signals are applied to respective channels 56 of a detector 58 for detecting the rate at which the amplitude of the signal varies (dV/dt). The detector is associated with a computer unit 60 programmed to identify the waveforms of signals that correspond to an intrusion. When such a condition is detected, the computer unit 60 sends a detection signal to an alarm station 62, optionally together with data indicating the zone concerned and the nature of the intrusion.

FIG. 5 is an example of readout, in the form of a graph, of the signals picked up by a FIG. 1 detection assembly installed in a corridor under surveillance. The ordinate represents the magnitude of the output signal expressed in relative values, and the abscissa represents a time scale.

At rest, the detector issues a base-line signal having relatively small fluctuations. When an intrusion occurs due to the presence of a human being, a peak of high amplitude is obtained.

In the example, the readout shows respective detection peaks for a person penetrating into the detection zone and jumping (peak A), a person passing in normal manner (peak B), and a person entering on tiptoe (peak C).

Peaks A to C are plotted for various distances between the person and the focus of the detection zone covering the range 2 meters (m) to 7 m, as shown in the figure.

It will be observed that the signal obtained is easily detectable in all of the above circumstances, in particular because of the fast response time of the detector and the very high sensitivity made possible by combining the sensor with a reflective type concentrator. It is possible to envisage signal discrimination in the computer unit 60 making it possible to obtain information about displacement in space and in time within the zone under surveillance, and also concerning the number of people present.

The detection system provides a detection signal that is caused by a change within the detector 14 of the thermal balance between radiation that is received and radiation that is retransmitted. The presence of an intruder in the detection field constitutes a modification of the temperature map of the zone under surveillance, either because extra heat is provided (the usual case) or because a heat source is masked, which can happen in an industrial site. Given that it is practically impossible to know the temperature of each point of the surface that is hidden by an intruder, and that the temperature of the intruder must be equal to the mean temperature of the surface hidden by the intruder if the thermal balance is to remain stable, it is extremely difficult to outwit a surveillance system based on devices of the present invention.

The invention lends itself to numerous variants both concerning the thermal radiation detector and concerning the concentrator.

The concentrator may be complex in shape, designed so that the detection field is matched to a perimeter of specific outline. In particular, it is possible for this purpose to make use of computer-assisted design tools operating on software for performing optical ray tracing.

What is claimed is:

1. A device for detecting radiation comprising:

a detector having a substrate which comprises, on a first face, at least one portion exposed to thermal radiation, and at least one portion protected from the thermal radiation, the detector being sensitive to a temperature difference between the at least one exposed portion and the at least one protected portion; and a reflector type concentrator associated with said detector to concentrate thereon the thermal radiation coming from a predetermined three-dimensional zone;

wherein a second face of the substrate, opposite to the first face, is in contact with an isothermal layer which extends parallel to the first face and faces the at least one exposed portion and the at least one protected portion at an equal distance.

2. A device (10) according to claim 1, further comprising means for analyzing the shape of the signal issued by the amplitude variation detector.

3. A device according to claim 1, wherein said detector (14) comprises at least one pair of planar thermocouple elements (34, 36) having a cold junction (40a) in thermal contact with said at least one protected portion, and at least one hot junction (40b) in thermal contact with said at least one exposed portion.

4. A device according to claim 1, wherein the at least one exposed portion and the at least one protected portion constitute a common active surface (42a) of the detector, and are respectively comprised of surface elements that are substantially absorbent (46) and by surface elements that are substantially reflective (44) relative to thermal radiation.

5. A device according to claim 4, wherein said detector (14) comprises a plurality of pairs of thermocouple elements (34, 36) mounted in series and disposed in a plurality of lines interconnected at their ends so as to form a meandering track (38), the cold and hot junctions (40a, 40b) being disposed in respective alternate rows extending across the lines and being in thermal contact with a film (42) which comprising said active surface (42a), said absorbent surface elements and said reflective surface elements are arranged in rows of alternating phase in alignment respectively with the cold junctions (40a) and with the hot junctions (40b).

6. A device according to claim 5, wherein said pairs of thermocouple elements (34, 36) are arranged as alternating elements of copper and of constantan deposited on said substrate (30) made of an electrically insulating material and said thermocouple elements are covered by said film such that said reflective surface elements cover said film over said cold junctions with a reflective material.

7. A device according to claim 6, wherein the surface (30a) of said substrate (30) opposite from its surface supporting said pairs of thermocouple elements (34, 36) is coated in a layer of metal (32) arranged to be put into contact with a mechanical support surface (24).

8. A device according to claim 6, wherein said substrate and said film each comprise of polyimide and said reflective material comprises of gold.

9. A device according to claim 1, wherein the reflector type concentrator is of the parabolic type.

10. A device according to claim 1, further comprising a support that supports said detector (14), the support being mounted to move along a determined axis (A–A') relative to said reflector.

11. Presence detection apparatus comprising at least one thermal radiation detector device (10) according to claim 10, together with monitoring means (54, 60) receiving the detection signal(s) and issuing a signal indicating presence as a function of the detection signal(s).

12. A device according to claim 1 further comprising an amplitude variation detector for detecting variations in the amplitude of signals picked up by said detector, said amplitude variation detector being associated with a computer programmed to identify waveforms of said signals.

* * * * *